(12) United States Patent
Zhu et al.

(10) Patent No.: US 8,354,343 B2
(45) Date of Patent: Jan. 15, 2013

(54) SEMICONDUCTOR STRUCTURE AND MANUFACTURING METHOD OF THE SAME

(75) Inventors: Huilong Zhu, Poughkeepsie, NY (US); Haizhou Yin, Poughkeepsie, NY (US); Zhijiong Luo, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 35 days.

(21) Appl. No.: 12/990,990

(22) PCT Filed: Sep. 19, 2010

(86) PCT No.: PCT/CN2010/001438
§ 371 (c)(1),
(2), (4) Date: Nov. 4, 2010

(87) PCT Pub. No.: WO2011/134128
PCT Pub. Date: Nov. 3, 2011

(65) Prior Publication Data
US 2011/0266677 A1    Nov. 3, 2011
US 2012/0292766 A2    Nov. 22, 2012

(30) Foreign Application Priority Data
Apr. 28, 2010 (CN) ............... 2010 1 0162118

(51) Int. Cl.
*H01L 23/48* (2006.01)
(52) U.S. Cl. ........... 438/653; 257/E21.584; 257/E23.01; 257/751

(58) Field of Classification Search .................. 257/751, 257/E21.584, E23.01; 438/653
See application file for complete search history.

(56) References Cited

U.S. PATENT DOCUMENTS

| | | | |
|---|---|---|---|
| 7,074,719 B2 | 7/2006 | Kim et al. | 438/687 |
| 2002/0105089 A1* | 8/2002 | Tanaka | 257/774 |
| 2005/0242402 A1* | 11/2005 | Ohkawa | 257/369 |
| 2007/0093050 A1* | 4/2007 | Son et al. | 438/618 |

FOREIGN PATENT DOCUMENTS
CN    1518119    8/2004

OTHER PUBLICATIONS

International Search Report and Written Opinion from related Application PCT/CN2010/001438 filed Apr. 28, 2010; 7 pages.

* cited by examiner

*Primary Examiner* — Marc Armand
(74) *Attorney, Agent, or Firm* — Westman, Champlin & Kelly, P.A.

(57) ABSTRACT

The present invention provides a semiconductor structure and a manufacturing method thereof. The method comprises: providing a semiconductor substrate comprising semiconductor devices; depositing a copper diffusion barrier layer on the semiconductor substrate; forming a copper composite layer on the copper diffusion barrier layer; decomposing the copper composite at corresponding positions, where copper interconnection is to be formed, into copper according to the shape of the copper interconnection; and etching off the undecomposed copper composite and the copper diffusion barrier layer underneath, to interconnect the semiconductor devices. The present invention is adaptive for manufacturing interconnection in integrated circuits.

20 Claims, 5 Drawing Sheets

SEMICONDUCTOR STRUCTURE AND MANUFACTURING METHOD OF THE SAME

CROSS-REFERENCE TO RELATED APPLICATION

This Application is a Section 371 National Stage Application of International Application No. PCT/CN2010/001438, filed 19 Sep. 2010, not yet published, the contents of which are hereby incorporated by reference in their entirety.

BACKGROUND OF THE INVENTION

1. Field of the Invention

The invention relates to the technology of semiconductor manufacture, and more particularly, to copper interconnection in a semiconductor structure and a manufacturing method thereof.

2. Description of the Prior Art

In the field of semiconductor manufacture, after the front end of line (FEOL) process of device, such as formation of semiconductor device structures and contact holes, is finished on a semiconductor chip, copper interconnection process is needed to connect the devices in the semiconductor chip with each other.

The typical process of copper interconnection is depositing a copper diffusion barrier layer on a dielectric layer before deposing copper, depositing copper on the copper diffusion barrier layer, and then planarizing the copper interconnection by removing excessive copper by Chemical Mechanical Polish (CMP).

The CMP process is expensive and may induce defects on copper surfaces.

SUMMARY OF THE INVENTION

To solve the above problems, one aspect of the present invention provides a manufacturing method of a semiconductor structure, comprising: providing a semiconductor substrate comprising semiconductor devices; depositing a copper diffusion barrier layer on the semiconductor substrate; forming a copper composite layer on the copper diffusion barrier layer; decomposing the copper composite at corresponding positions, where the copper interconnection is to be formed, into copper, according to the shape of copper interconnection; and etching off the undecomposed copper composite and the copper diffusion barrier layer underneath, to interconnect the semiconductor devices.

Preferably, the copper composite is $Cu_3N$.

Decomposing the copper composite into copper may comprise: depositing an oxide layer on the $Cu_3N$ layer; applying a photoresist layer on the oxide layer, which is patterned according to the shape of the copper interconnection; etching the oxide layer to form a hard mask by using the patterned photoresist layer as a mask; selectively etching the $Cu_3N$ layer and the copper diffusion barrier layer after removing the photoresist layer; and decomposing the $Cu_3N$ by annealing after removing the hard mask, to form the copper interconnection.

Preferably, the $Cu_3N$ layer and the copper diffusion barrier layer are selectively etched by HF, and the temperature for annealing may be 260~600° C.

Decomposing the copper composite into copper may comprise: applying a photoresist layer on the $Cu_3N$ layer, which is patterned according to the shape of the copper interconnection; bombarding the Cu3N layer by an electron beam by using the patterned photoresist layer as a mask to decompose the Cu3N into copper; removing the photoresist layer; and etching the Cu3N layer and the copper diffusion barrier layer to form the copper interconnection.

Preferably, the $Cu_3N$ layer and the copper diffusion barrier layer are selectively etched by HF.

In the above solution, preferably, the copper diffusion barrier layer may be formed of at least one of TaN, TiN, Ta, Ti, TiSiN, TaSiN, TiW, WN, and Ru. For example, it can be formed of at least a TaN layer and at least a Ta layer, wherein the TaN layer contacts with an interlayer dielectric layer underneath.

The copper diffusion barrier layer can be formed of at least a TaN layer and at least a Ru layer. The TaN layer for example contacts with an interlayer dielectric layer underneath.

The thickness of the copper diffusion barrier layer is preferable 10~500 nm.

Preferably, after decomposing the copper composite into copper, the method further comprises: depositing an insulating dielectric layer on the semiconductor substrate; processing the insulating dielectric layer by reactive ion etching (RIE) to form spacers on sidewalls of the copper interconnection. The insulating dielectric layer can be formed of at least one of TaN, TiN, Ta, Ti, TiSiN, TaSiN, TiW, WN, and Ru.

Another aspect of the present invention provides a manufacturing method of a semiconductor structure, comprising: providing a semiconductor substrate comprising semiconductor devices; depositing a copper diffusion barrier layer on the semiconductor substrate; forming a copper composite layer on the copper diffusion barrier layer; decomposing the copper composite at corresponding positions, where the copper interconnection is to be formed, into copper, according to the shape of the copper interconnection; etching off the undecomposed copper composite and the copper diffusion barrier layer underneath, to interconnect the semiconductor devices; depositing an insulating dielectric layer on the semiconductor substrate, and processing the insulating dielectric layer by RIE to form spacers on sidewalls of the copper interconnection.

Preferably, the copper diffusion barrier layer may comprise at least one of TaN, TiN, Ta, Ti, TiSiN, TaSiN, TiW, WN, and Ru.

The copper diffusion barrier layer can be formed of at least a TaN layer and at least a Ta layer.

A further aspect of the present invention provides a semiconductor structure, comprising: a semiconductor substrate comprising semiconductor devices; a copper diffusion barrier layer on the semiconductor devices; copper interconnection on the copper diffusion barrier layer for electrically connecting the semiconductor devices; and copper diffusion barrier spacers at side surfaces of the copper interconnection.

The spacers are formed of at least one of TaN, TiN, Ta, Ti, TiSiN, TaSiN, TiW, WN, and Ru.

Preferably, the copper diffusion barrier layer may be formed of at least one of TaN, TIN, Ta, Ti, TiSiN, TaSiN, TiW, WN, and Ru. For example, it can be formed of at least a TaN layer and at least a Ta layer, wherein the TaN layer contacts with an oxide layer underneath.

The copper diffusion barrier layer can be formed of at least a TaN layer and at least a Ru layer. The TaN layer for example contacts with an oxide layer underneath.

The thickness of the copper diffusion barrier layer is preferably 10~500 nm.

The semiconductor device and the manufacturing method thereof provided by the present invention does not need to planarize the copper interconnection by CMP, and therefore reduces the cost and defects. Spacers are provided on both sides of the copper interconnection to prevent copper atoms from diffusing outside.

BRIEF DESCRIPTION OF THE DRAWINGS

The above and other objects, characteristic, and advantages of the present invention will become apparent from the following description in connection with the drawings, wherein.

DETAILED DESCRIPTION OF THE PREFERRED EMBODIMENTS

The present invention will be described by specific embodiments shown in the figures. However, it should be understood that the descriptions are only exemplary, but do not intent to limit the scope of the present invention. Further, in the descriptions, detailed explanations on known structures and techniques are omitted, in order not to unnecessarily obscure the concept of the present invention.

The figures show schematic views of the layer structure according to embodiments of the present invention. The figures are not drawn to scale. Some details may be zoomed in and some may be omitted for clarity. The shapes of various regions and layers, and the relative sizes and position relationships thereof are only exemplary, and may be varied due to manufacture tolerance or technique limitations in actual circumstances. Those skilled in the art can design regions/layers with different shapes, sizes, or relative positions according to actual requirements.

The manufacturing method for a semiconductor structure according to a first embodiment of the present invention will be described with reference to FIGS. 1~6.

Figure 1:
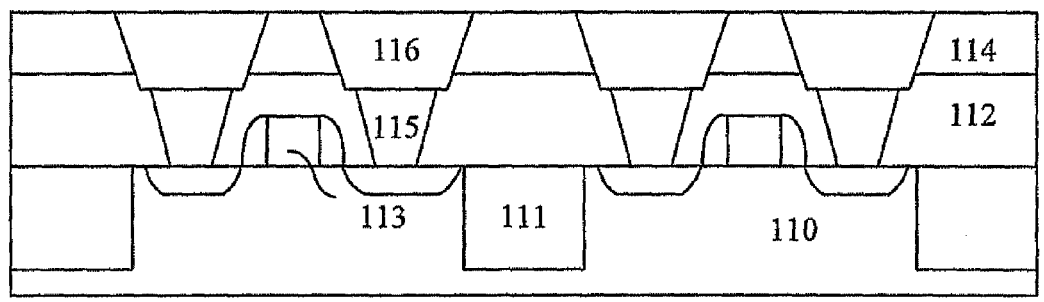
FIGS. 1~6 show sectional views of the device structure in each step of the copper interconnection manufacturing method according to a first embodiment of the present invention.

As shown in FIG. 1, protection layers (not shown) comprising oxide layers and nitride layers are formed in the silicon substrate 110. Then STI (shallow trench isolation) structures 111 are formed in the silicon substrate 110. MOS transistors 113 are manufactured in active regions isolated by the STI structures 111. FIG. 1 shows the source region and the drain region of the MOS transistor for concision. The manufacture of the MOS transistor can be accomplished by conventional techniques, and is not crucial to the implementation of the present invention, so the detailed explanation thereof is omitted herein.

A first interlayer dielectric layer 112 is deposited on the silicon substrate 110. Contact holes for contacting with the source region and the drain region of the transistor 113 are formed by etching the first interlayer dielectric layer 112. Metal plugs 115 are formed in the contact holes. Metals of Ti, Co, or Ni can be deposited in the source/drain regions before depositing the first interlayer dielectric layer 112 or after forming the contact holes by etching. Then a metal silicide contact is formed by high-temperature annealing to is reduce the resistance of the source/drain regions.

Then a second interlayer dielectric layer 114 is deposited on the first interlayer dielectric layer 112, and contact holes comprising the ones on the gate (not shown) are formed in the second interlayer dielectric layer 114 by etching. Metal plugs 116 are formed in the contact holes. The metal plugs are usually formed of Al, Cu, or W.

It should be noted that the semiconductor structure shown in FIG. 1 is one of typical structures in the integrated circuit field, and are used as an example to illustrate the concept of the present invention. The present invention can be applied to any semiconductor structures in which copper interconnections are to be manufactured on the contact holes.

Figure 2:
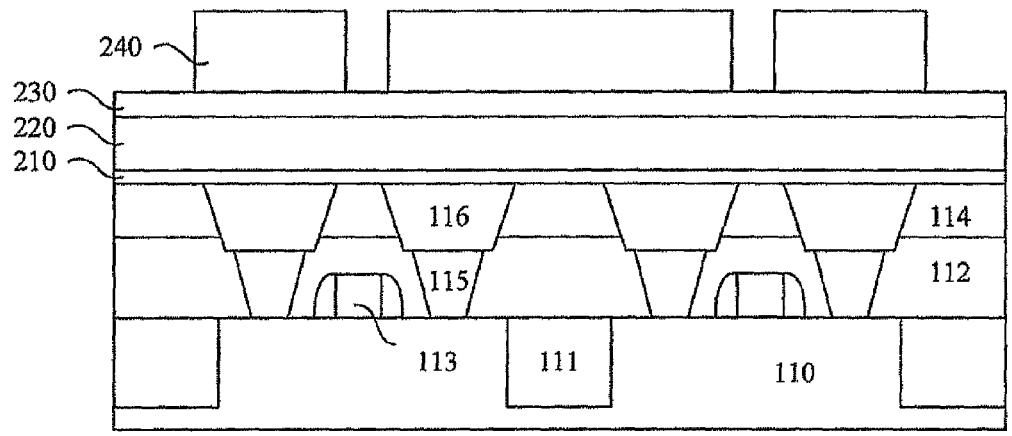

Next, as shown in FIG. 2, a copper diffusion barrier layer 210 is deposited on the second interlayer dielectric layer 114. The copper diffusion barrier layer 210 may be formed of at least one of TaN, TiN, Ta, Ti, TiSiN, TaSiN, TiW, WN, and Ru. For example, it may be formed of at least a TaN layer and at least a Ta layer. The TaN layer contacts the second interlayer dielectric layer 114 underneath. Therefore, the TaN layer can act as the adhesive between the Ta layer and the second interlayer dielectric layer 114 underneath.

The copper diffusion barrier layer may also be formed of at least a TaN layer and at least a Ru layer. For example, the TaN layer can contact the second interlayer dielectric layer 114 underneath, such that the TaN can act as the adhesive between the Ru layer and the second interlayer dielectric layer 114 underneath. Further, the copper diffusion barrier layer may also be formed of at least a TiN layer and at least a Ti layer. For example, the Ti layer can contact the second interlayer dielectric layer 114 underneath, such that the Ti can act as the adhesive between the TiN layer and the second interlayer dielectric layer 114 underneath.

The thickness of the copper diffusion barrier layer is preferably 10~500 nm.

A copper composite layer 220 is deposited on the copper diffusion barrier layer 210. The copper composite layer 220 can be formed by e.g. atom layer deposition or reactive RF magnetron sputtering. The copper composite layer can preferably be a $Cu_3N$ layer, and the thickness thereof can be 10~500 nm. An oxide layer 230, such as a $SiO_2$ layer, with the thickness of 10~50 nm can be deposited on the $Cu_3N$ layer 220. Next, a photoresist layer is applied on the oxide layer 230, and is patterned according to the shape of the copper interconnection to be manufactured, to form a patterned photoresist layer 240. The patterned photoresist layer 240 has the same shape as that of the copper interconnection to be manufactured.

Figure 3:
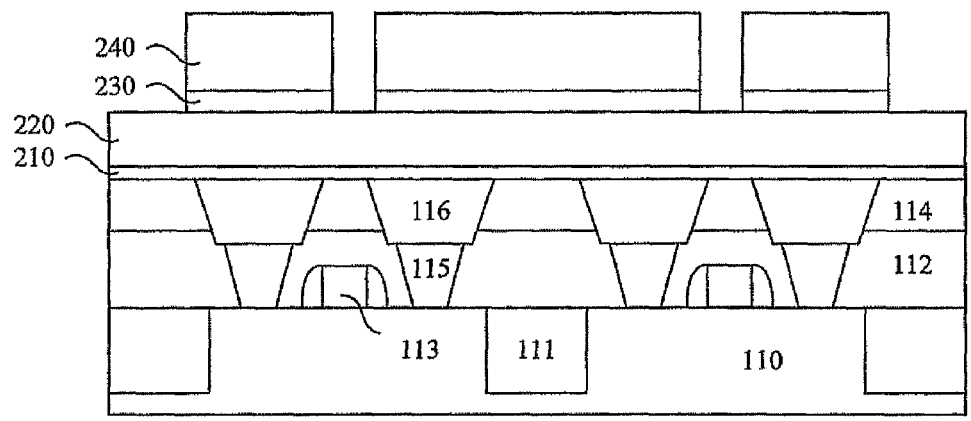

Next, as shown in FIG. 3, the oxide layer 230 is processed by RIE by using the patterned photoresist layer 240 as a mask, to form an oxide hard mask.

Figure 4:
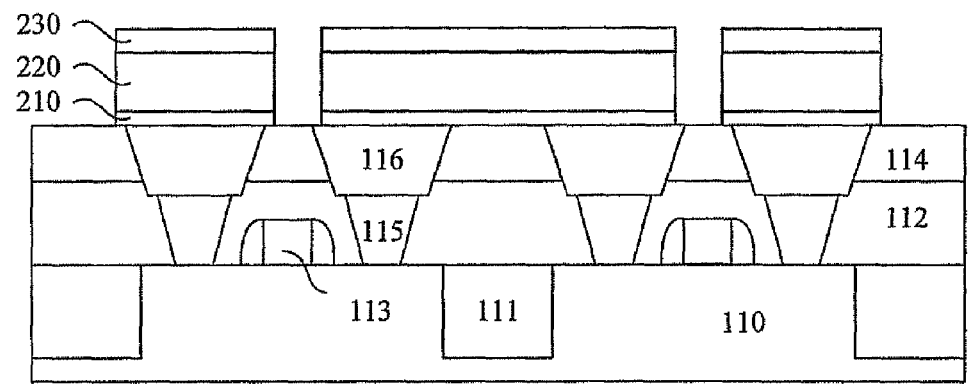

Next, as shown in FIG. 4, the photoresist layer is removed. The $Cu_3N$ layer 220 and the copper diffusion barrier layer 210 are selectively etched by HF. The result of etching is shown in FIG. 4. The etching stops at the second interlayer dielectric layer. The $Cu_3N$ layer 220 and the copper diffusion barrier layer 210 are easy to be etched by HF, but the oxide layer 230 is not. Therefore, the oxide layer 230, the $Cu_3N$ layer 220 and the copper diffusion barrier layer 210 form three-layer structures distributed separately, which have a shape corresponding to the copper interconnection to be manufactured, so as to interconnect the contact holes that need to be connected.

Figure 5:
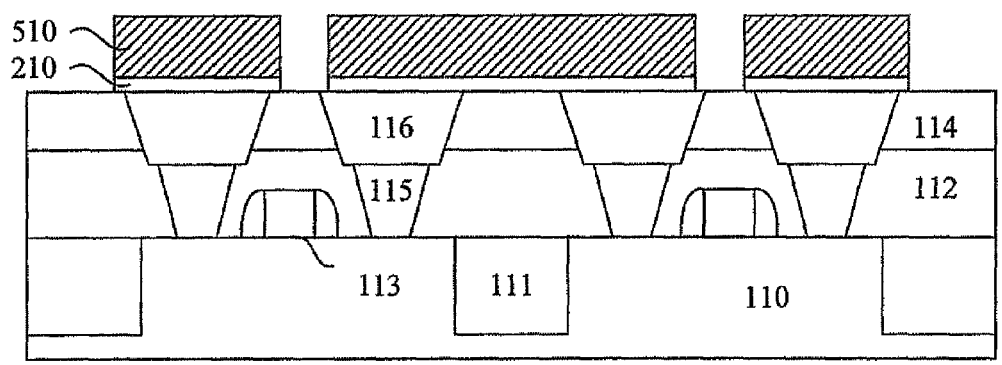

Next, as shown in FIG. 5, the oxide hard mask 230 is removed by RIE. Preferably, the whole semiconductor structure is annealed at 260~600° C. The $Cu_3N$ is decomposed into Cu by the annealing to form the copper interconnection 510 shown in FIG. 5.

Optionally, spacers 610 can be formed on sidewalls of the copper interconnection as copper diffusion barriers, if necessary. In particular, a TaN layer with the thickness of 2~10 nm can be deposited on the second interlayer dielectric layer 114, and is etched to form TaN spacers 610 by RIE. The spacer 610 can be formed of at least one of TaN, TiN, Ta, Ti, TiSiN, TaSiN, TiW, WN, and Ru. This solution is also a manufacture method of a semiconductor structure according to another embodiment of the present invention.

The manufacturing method for a semiconductor structure according to a second embodiment of the present invention is described with reference to FIGS. 7~9, wherein same parts as FIGS. 1~6 are indicated by the same reference numbers.

In a similar manner as shown in FIG. 1, a semiconductor substrate 110, semiconductor devices 113, a first interlayer dielectric layer 112, a second interlayer dielectric layer 114, and contact holes 115, 116 are formed.

Figure 7:
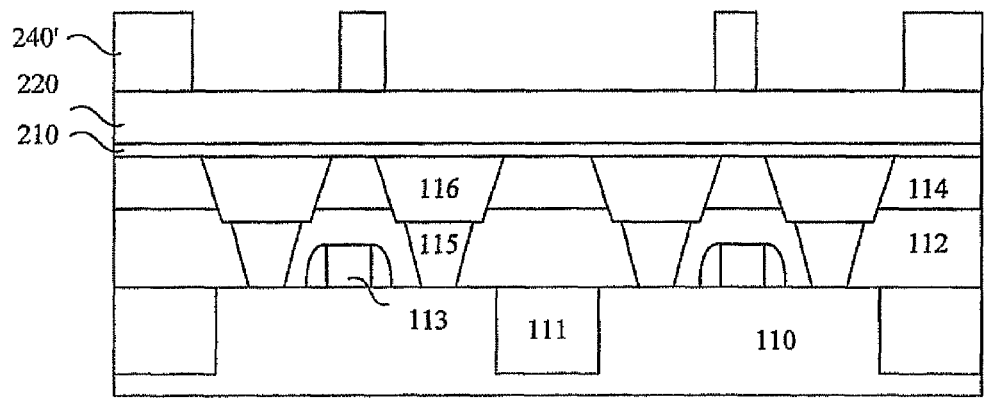
FIGS. 7~9 show sectional views of the device structure in each step of the copper interconnection manufacturing method according to a second embodiment of the present invention.

As shown in FIG. 7, a material such as TaN or other materials are deposited on the second interlayer dielectric layer 114 to form the copper diffusion barrier layer 210. The $Cu_3N$ layer 220 or another copper composite layer with the thickness of 10~500 nm is formed on the copper diffusion barrier layer 210 by atom layer deposition or reactive RF magnetron sputtering. Next, a photoresist layer is applied on the $Cu_3N$ layer 220, and is patterned according to the shape of the copper interconnection to be manufactured, to form a patterned photoresist layer 240'. The patterned photoresist layer 240' has a shape that is complementary to that of the copper interconnection to be manufactured. As shown in FIG. 7, the photoresist on the $Cu_3N$ corresponding to the copper interconnection to be manufactured has been etched off, while the $Cu_3N$ under the remaining photoresist needs to be etched later.

Figure 8:
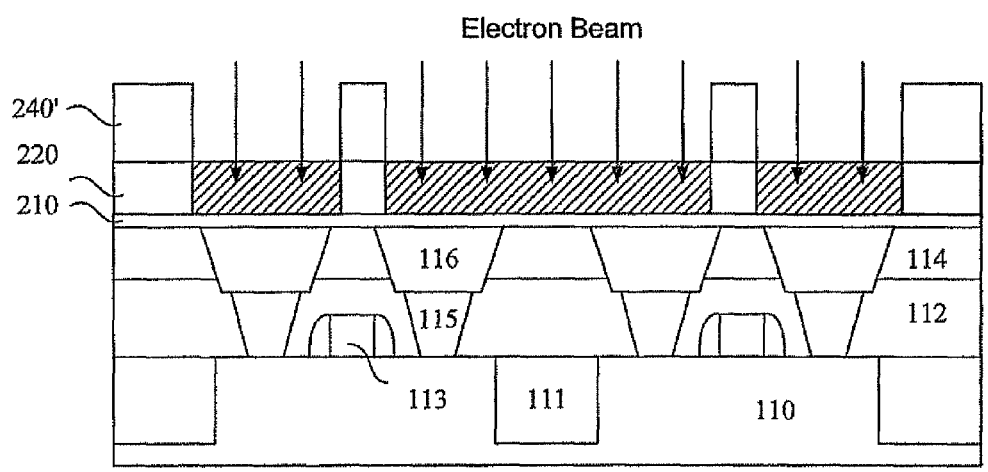

Next, as shown in FIG. 8, the $Cu_3N$ layer 220 is bombarded by an electron beam by using the patterned photoresist layer 240' as a mask, to decompose the $Cu_3N$ into copper.

Figure 9:
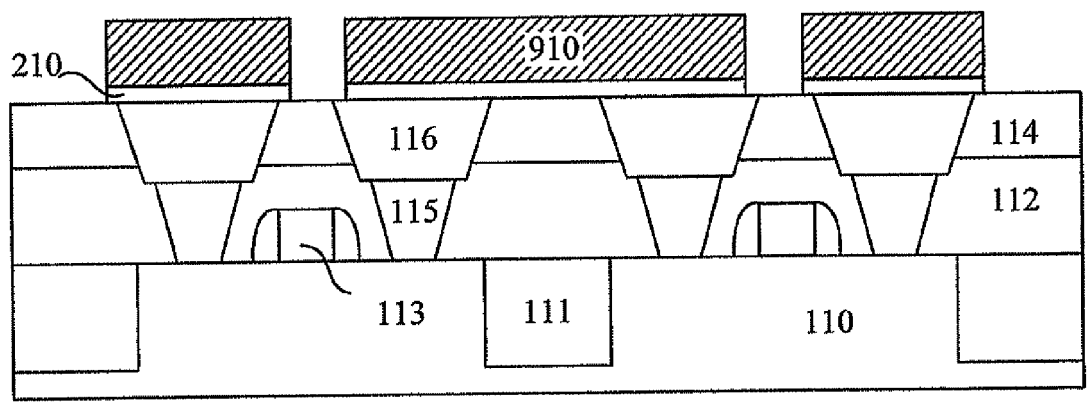

Next, as shown in FIG. 9, the patterned photoresist layer 240' is removed, and the $Cu_3N$ layer 220 and the copper diffusion barrier layer 210 are etched by HF. The $Cu_3N$ and corresponding parts of the diffusion barrier layer are dissolved, and thus the copper interconnection 910 is formed.

In a similar manner as in the first embodiment, TaN spacers 610 can be formed on the sidewalls of the copper interconnection as copper diffusion barriers. The spacers 610 can be formed of at least one of TaN, TiN, Ta, Ti, TiSiN, and Ru. This solution is also a manufacture method of a semiconductor structure according to another embodiment of the present invention.

Figure 6:
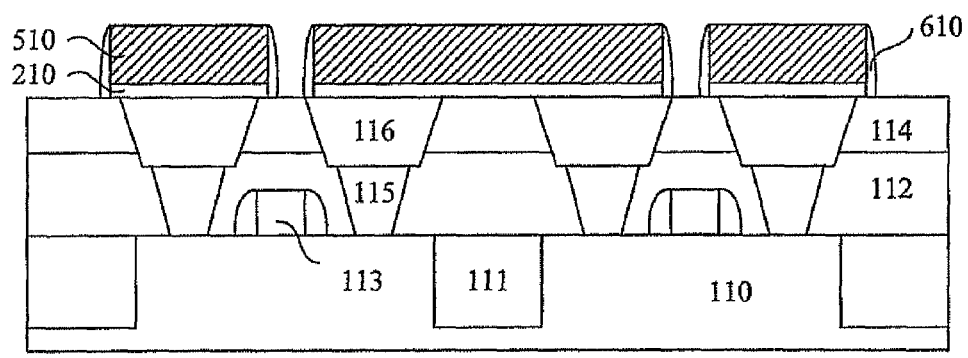

Therefore, a semiconductor structure according to another embodiment of the present invention is obtained. As shown in FIG. 6, the semiconductor structure comprises: a semiconductor substrate 110 comprising semiconductor devices 113; a copper diffusion barrier layer 210 on the semiconductor devices 113; a copper interconnection 220 on the copper diffusion barrier layer 210 for electrically connecting the semiconductor devices 113; and copper diffusion barrier spacers 610 at side surfaces of the copper interconnection.

The copper diffusion barrier layer 210 may be formed of at least one of TaN, TiN, Ta, Ti, TiSiN, TaSiN, TiW, WN, and Ru. For example, it may be formed of at least a TaN layer and at least a Ta layer. The TaN layer contacts the second interlayer dielectric layer 114 underneath. Therefore, the TaN layer can act as the adhesive between the Ta layer and the second interlayer dielectric layer 114 underneath.

The copper diffusion barrier layer 210 may also be formed of at least a TaN layer and at least a Ru layer. For example, the TaN layer can contact the second interlayer dielectric layer 114 underneath, such that the TaN can act as the adhesive between the Ru layer and the second interlayer dielectric layer 114 underneath. Further, the copper diffusion barrier layer 210 may also be formed of at least a TIN layer and at least a Ti layer. For example, the Ti layer can contact the second interlayer dielectric layer 114 underneath, such that the Ti can act as the adhesive between the TiN layer and the second interlayer dielectric layer 114 underneath.

The thickness of the copper diffusion barrier layer is preferably 10~500 nm.

Preferably, the spacers 610 may be formed of at least one of TaN, TiN, Ta, Ti, TiSiN, TaSiN, TiW, WN, and Ru.

In the semiconductor structure formed according to the method of the present invention, the manufacture cost of the copper interconnection is low and the process is simple. There is no need of the CMP process, which is expensive and may induce defects. Therefore, a copper interconnection manufacturing process is provided with a low cost and good performance. According to the copper interconnection structure and its manufacturing method provided by the present invention, the spacers on both sides of the copper interconnection can prevent the copper from diffusing to other structures of the device.

The above description is only for explaining embodiments of the present invention, rather than limiting the scope of the present invention. Those skilled in the art should understand that the scope of the present invention is defined by the appended claims. Any modifications or alternations that do not depart from the spirit and concept of the present invention will fall within the protection scope of the present invention.

What is claimed is:

1. A manufacturing method of a semiconductor structure, comprising:
    providing a semiconductor substrate comprising semiconductor devices;
    depositing a copper diffusion barrier layer on the semiconductor substrate;
    forming a copper composite layer on the copper diffusion barrier layer;
    decomposing the copper composite at corresponding positions, where copper interconnection is to be formed, into copper according to the shape of the copper interconnection; and
    etching off the undercomposed copper composite and the copper diffusion barrier layer underneath, to interconnect the semiconductor devices.

2. The method according to claim 1, wherein the copper composite is $Cu_3N$.

3. The method according to claim 1, wherein the copper diffusion barrier layer is formed of at least one of TaN, TiN, Ta, Ti, TiSiN, TaSiN, TiW, WN and Ru.

4. The method according to claim 1, wherein after decomposing the copper composite into copper, the method further comprises:
    depositing an insulating dielectric layer on the semiconductor substrate; processing the insulating dielectric layer by RIE to form spacers on sidewalls of the copper interconnection.

5. The method according to claim 2, wherein decomposing the copper composite into copper and etching off the undercomposed copper composite and the copper diffusion barrier layer underneath comprises:
    depositing an oxide layer on the $Cu_3N$ layer;
    applying a photoresist layer on the oxide layer, and patterning the photoresist layer according to the shape of the copper interconnection;
    etching the oxide layer to form a hard mask by using the patterned photoresist layer as a mask;
    selectively etching the $Cu_3N$ layer and the copper diffusion barrier layer after removing the photoresist layer; and
    decomposing the $Cu_3N$ by annealing after removing the hard mask, to form the copper interconnection.

6. The method according to claim 2, wherein decomposing the copper composite into copper and etching off the undercomposed copper composite and the copper diffusion barrier layer underneath comprises:
applying a photoresist layer on the $Cu_3N$ layer, and patterning the photoresist layer according to the shape of the copper interconnection;
bombarding the Cu3N layer by an electron beam by using the patterned photoresist layer as a mask to decompose the Cu3N into copper;
removing the photoresist layer; and
etching the $Cu_3N$ layer and the copper diffusion barrier layer to form the copper interconnection.

7. The method according to claim 3, wherein the copper diffusion barrier layer is formed of at least a TaN layer and at least a Ta layer.

8. The method according to claim 3, wherein the copper diffusion barrier layer is formed of at least a TaN layer and at least a Ru layer.

9. The method according to claim 3, wherein the copper diffusion barrier layer is formed of at least a TiN layer and at least a Ti layer.

10. The method according to claim 4, wherein the insulating dielectric layer is formed of at least one of TaN, TiN, Ta, Ti, TiSiN, TaSiN, TiW, WN, and Ru.

11. The method according to claim 5, wherein selectively etching the $Cu_3N$ layer and the copper diffusion barrier layer comprises: selectively etching the $Cu_3N$ layer and the copper diffusion barrier layer by using HF.

12. The method according to claim 5, wherein the temperature for annealing is 260~600° C.

13. The method according to claim 6, wherein etching the $Cu_3N$ layer and the copper diffusion barrier layer comprises: selectively etching the $Cu_3N$ layer and the copper diffusion barrier layer by HF.

14. The method according to claim 7, wherein the thickness of the copper diffusion barrier layer is 10~500 nm.

15. A manufacturing method of a semiconductor structure, comprising:
providing a semiconductor substrate comprising semiconductor devices, and at least two contact holes with a metal plug in each contact hole;
depositing a copper diffusion barrier layer on the semiconductor substrate;
forming a copper composite layer on the copper diffusion barrier layer;
decomposing the copper composite at corresponding positions, where copper interconnection is to be formed, into copper according to the shape of the copper interconnection;
etching off the undercomposed copper composite and the copper diffusion barrier layer underneath, to interconnect the metal plugs; and
depositing an insulating dielectric layer on the semiconductor substrate, and processing the insulating dielectric layer by RIE to form spacers on sidewalls of the copper interconnection.

16. The method according to claim 15, wherein the copper diffusion barrier layer is formed of at least one of TaN, TiN, Ta, Ti, TiSiN, TaSiN, TiW, WN, and Ru.

17. The method according to claim 15, wherein the thickness of the copper diffusion barrier layer is 10~500 nm.

18. The method according to claim 16, wherein the copper diffusion barrier layer is formed of at least a TaN layer and at least a Ta layer.

19. The method according to claim 16, wherein the copper diffusion barrier layer is formed of at least a TaN layer and at least a Ru layer.

20. The method according to claim 16, wherein the copper diffusion barrier layer is formed of at least a TiN layer and at least a Ti layer.

* * * * *